United States Patent
Benjamin et al.

(10) Patent No.: US 9,618,569 B2
(45) Date of Patent: Apr. 11, 2017

(54) METHOD AND APPARATUS FOR TESTING IC

(75) Inventors: Ofer Benjamin, Haifa (IL); Igal Sade, Haifa (IL); Nasim Nasser, Haifa (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 226 days.

(21) Appl. No.: 13/402,439

(22) Filed: Feb. 22, 2012

(65) Prior Publication Data

US 2012/0212246 A1    Aug. 23, 2012

Related U.S. Application Data

(60) Provisional application No. 61/445,839, filed on Feb. 23, 2011, provisional application No. 61/507,916, filed on Jul. 14, 2011.

(51) Int. Cl.
*G01R 31/28* (2006.01)
*G01R 31/317* (2006.01)

(52) U.S. Cl.
CPC ... *G01R 31/2874* (2013.01); *G01R 31/31718* (2013.01)

(58) Field of Classification Search
CPC .......................... G01R 31/2642; G01R 31/2874
See application file for complete search history.

(56) References Cited

U.S. PATENT DOCUMENTS

| | | | | |
|---|---|---|---|---|
| 5,625,288 | A * | 4/1997 | Snyder et al. | 324/750.06 |
| 6,876,220 | B2 * | 4/2005 | Witte | 324/754.23 |
| 7,233,163 | B2 * | 6/2007 | Krishnamoorthy et al. | 324/762.02 |
| 7,734,444 | B2 * | 6/2010 | Arroyo et al. | 702/136 |
| 8,326,906 | B2 * | 12/2012 | Tsatsanis et al. | 708/321 |
| 2005/0114056 | A1 * | 5/2005 | Patel | G01R 31/2882 702/75 |
| 2006/0164111 | A1 * | 7/2006 | Lopez et al. | 324/760 |

OTHER PUBLICATIONS

Combined Taiwanese Office Action and Search Report issued Jan. 20, 2016 in Patent Application No. 101106404 (with English Translation of Categories of Cited Documents).

* cited by examiner

*Primary Examiner* — Feba Pothen

(57) ABSTRACT

A testing method includes measuring an electrical parameter of a device under test (DUT) and a corresponding temperature of the DUT one or more times, determining coefficients in a pre-constructed model based on a plurality of measured values of the electrical parameter and corresponding measured temperatures to characterize a relationship of the electrical parameter to the temperature, and determining a quality of the DUT based on the model and a limit value of the electrical parameter at a specified temperature. The model is pre-constructed to characterize the relationship of the electrical parameter to the temperature with the coefficients that are DUT-dependent variables.

20 Claims, 8 Drawing Sheets

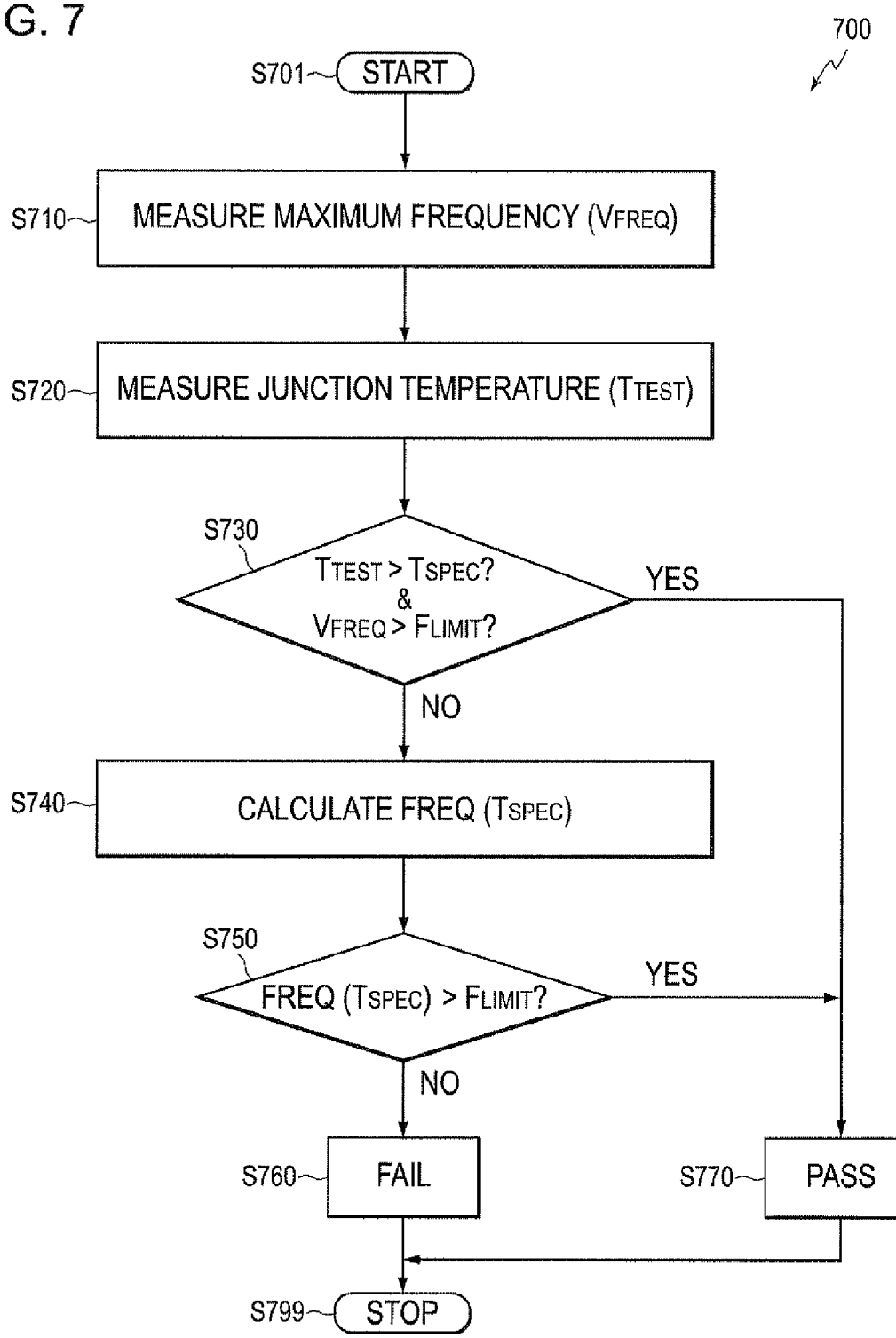

METHOD AND APPARATUS FOR TESTING IC

INCORPORATION BY REFERENCE

This present disclosure claims the benefit of U.S. Provisional Applications No. 61/445,839, "Parametric Temperature Adjustment During IC Testing" filed on Feb. 23, 2011, and No. 61/507,916, "Adjusting frequency measurement on ATE due to Temperature Fluctuation", filed on Jul. 14, 2011, which are incorporated herein by reference in their entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Electrical parameters of electrical circuits, such as current consumption, maximum working frequency, and the like, are tested to determine quality of the circuit based on measured values. The electrical parameters can be sensitive to temperature. Thus, temperature fluctuation can affect the measured values, and change test results.

SUMMARY

Aspects of the disclosure provide a method for testing. The method includes measuring an electrical parameter of a device under test (DUT) and a corresponding temperature of the DUT one or more times, determining coefficients in a pre-constructed model based on a plurality of measured values of the electrical parameter and corresponding measured temperatures to characterize a relationship of the electrical parameter to the temperature, and determining a quality of the DUT based on the model and a limit value of the electrical parameter at a specified temperature. The model is pre-constructed to characterize the relationship of the electrical parameter to the temperature with the coefficients that are DUT-dependent variables.

To determine the quality of the DUT, in an embodiment, the method includes determining a value for the electrical parameter at the specified temperature according to the model, and comparing the determined value to the limit value to determine the quality of the DUT. In another embodiment, the method includes determining a temperature value at which the DUT has the limit value of the electrical parameter according to the model, and comparing the determined temperature value to the specified temperature to determine the quality of the DUT.

According to an aspect of the disclosure, to measure the electrical parameter of the DUT and the corresponding temperature of the DUT, the method includes testing the DUT according to a test flow that includes a plurality of parametric tests inserted in a sequence of other tests, and measuring the electrical parameter of the DUT and the corresponding temperature in response to each of the parametric tests.

Aspects of the disclosure provide a test system. The test system includes an interface and a controller. The interface is configured to measure an electrical parameter of a device under test (DUT) and a corresponding temperature of the DUT. The controller is configured to control the interface to measure the electrical parameter of the DUT and the corresponding temperature of the DUT one or more times, determine coefficients in a pre-constructed model based on the measured values of the electrical parameter and the corresponding measured temperatures to characterize a relationship of the electrical parameter to the temperature, and determine a quality of the DUT based on the model and a limit value of the electrical parameter at a specified temperature. The model is pre-constructed to characterize the relationship of the electric parameter to the temperature with the coefficients that are DUT-dependent variables.

Aspects of the disclosure provide another method for testing an integrated circuit product. The method includes constructing a model for modeling an electrical parameter of a device changing with a temperature. The model includes a plurality of coefficients that are device-under-test (DUT) dependent variables. Further, the method includes determining an integer number that the integer number of measurements of the electrical parameter and the corresponding temperature provides a suitable indication of the device meeting the electrical parameter at a specified temperature that is not measured. Then, the method includes performing, for at least the integer number of times on a DUT, a parametric test measuring the electrical parameter and the corresponding temperature, and ascertaining a quality of the DUT to meet a threshold at a non-measured temperature based on the model and the parametric test.

BRIEF DESCRIPTION OF THE DRAWINGS

Various embodiments of this disclosure that are proposed as examples will be described in detail with reference to the following figures, wherein like numerals reference like elements, and wherein:

FIG. 7 shows a flow chart outlining a process example 700 for testing a circuit according to an embodiment of the disclosure.

DETAILED DESCRIPTION OF EMBODIMENTS

Figure 1:
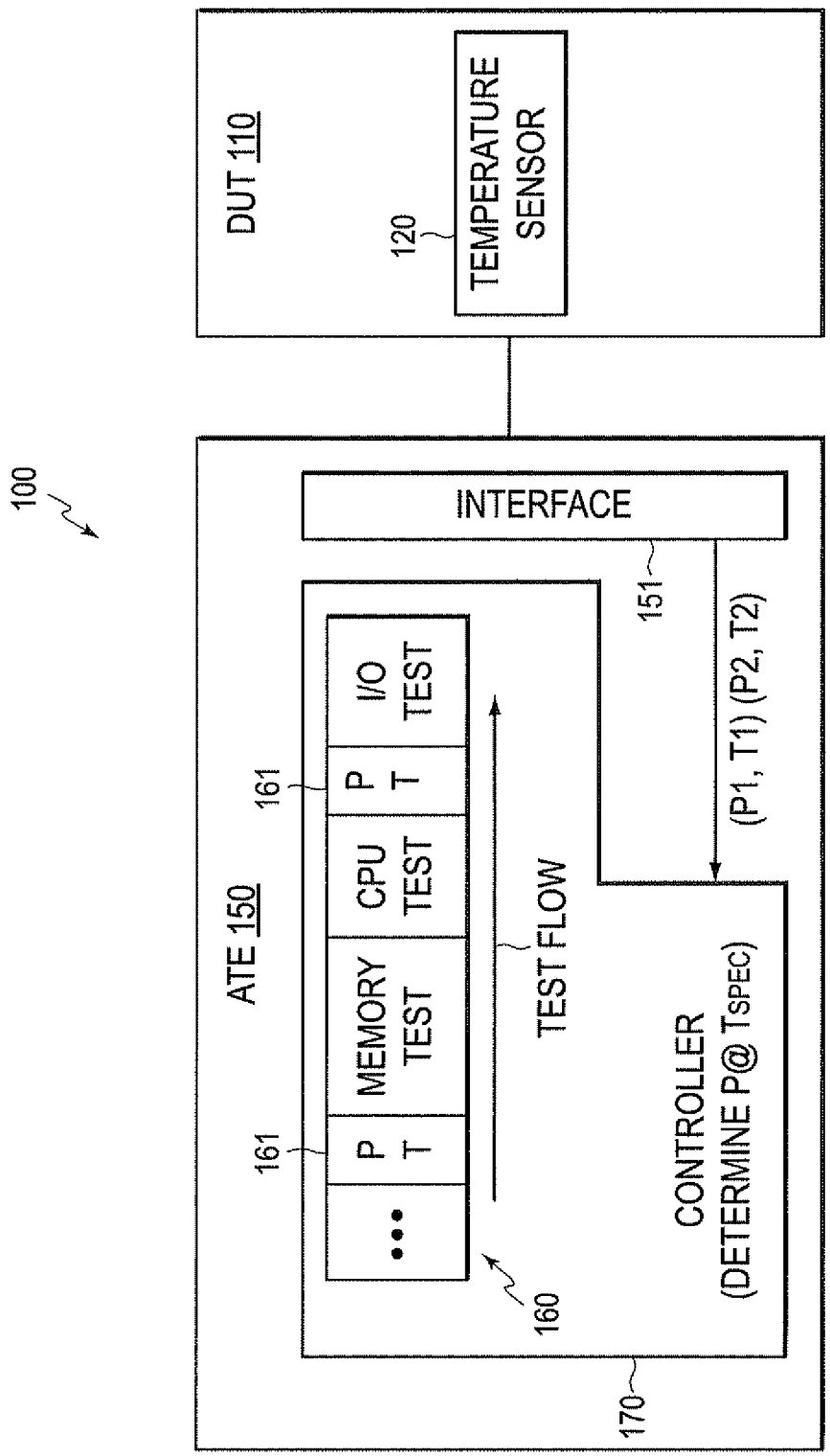
FIG. 1 shows a block diagram of a test system example 100 according to an embodiment of the disclosure.

FIG. 1 shows a block diagram of a test system example 100 according to an embodiment of the disclosure. The test system 100 includes automatic test equipment (ATE) 150 and device under test (DUT) 110. The ATE 150 and the DUT 110 are suitably coupled together via a prober or a handler, for example. The ATE 150 acts on the DUT 110 according to a test flow 160, and receives test results. A quality of the DUT 110, that is its fitness to meet specified performance requirements, is then determined based on the test results.

According to an embodiment of the disclosure, the test flow 160 includes a plurality of parametric tests (PT) 161 that are separated by other tests, such as I/O test, CPU test, memory test, and the like. Each PT 161 performs a measurement of one or more electrical parameters, such as current consumption, an operational frequency, and the like. Because of correspondence between the electrical parameter and temperature, temperature is also measured. Based on the measurements of the electrical parameters (e.g., P1, P2) and the corresponding measurements of the temperature (e.g., T1, T2), the quality of the DUT 110, and more specifically its fitness to a meet a performance specification, is determined.

In an embodiment, the quality of the DUT 110 is determined based on a limit value of an electrical parameter at a specified temperature ($T_{SPEC}$). In an embodiment, the corresponding temperatures (e.g., T1, T2) at which the electrical parameters are measured are not the same as a temperature ($T_{SPEC}$) that is specified in a product datasheet specification. Instead, in an embodiment, the ATE 150 calculates a value of the electrical parameter at the specification temperature ($T_{SPEC}$) based on the measurements of the electrical parameter (e.g., P1, P2) at one or more temperatures (e.g. T1, T2) that are different from the specification temperature ($T_{SPEC}$). Then, the ATE 150 compares the calculated value to the limit value of the electrical parameter to determine the quality of the DUT 110.

The DUT 110 can be any suitable device. In an embodiment, the DUT 110 is one of a plurality of integrated circuit (IC) chips on a wafer. In another embodiment, the DUT 110 is an IC package that includes an IC chip and other circuit components, such as a ball grid array substrate or other suitable circuit interface, and an encapsulation medium.

According to an embodiment of the disclosure, the DUT 110 includes a temperature sensor 120 that is configured to measure a temperature. In an example, the temperature sensor 120 includes a circuit component, such as a diode or other suitable temperature measuring circuitry on the IC chip to measure an on-chip temperature. In an example, diode current is indicative of a junction temperature. In another example, U.S. Pat. No. 7,726,877 discloses Method and Apparatus of Measuring Temperature, the disclosure of which is incorporated by reference in its entirety.

It is noted that, in another example, the temperature sensor 120 is an off chip component to measure the chip temperature. In an example, the temperature sensor 120 is in contact with the IC chip. In another example, the temperature sensor 120 is in a close proximity to the IC chip to measure a chip temperature. In another example, the temperature sensor 120 is not need to be in the close proximity to the IC chip to measure the chip temperature.

According to an embodiment of the disclosure, a temperature profile of a DUT 110 changes due to various factors, such as process variation, handler to handler variation, handler setup, device order and the like. In an example, a first DUT 110 starts a test at 85° C., and finishes the test at 140° C.; and a second DUT 110 starts a test at 95° C., and finishes the test at 80° C.

Further, electrical parameters are sensitive to temperature. For example, a first measurement of the static current consumption of a DUT 110 at a relatively higher temperature can be larger than a second measurement of the static current consumption of the same DUT 110 at a relatively lower temperature. Thus, in an embodiment, comparing measurements to the limit value without considering the temperature of the DUT 110 at the time of the measurement can lead to undesirable consequence, such as high yield loss or customer returns.

However, adjusting the temperature of the DUT 110 to the specified temperature can be time consuming and increase test time and cost. According to an embodiment of the disclosure, the test system 100 is configured to determine the value of the electrical parameter at a specified temperature ($T_{SPEC}$) based on a pre-constructed model and parametric measurements of electrical parameters at temperatures other than at the specified temperature ($T_{SPEC}$).

According to an aspect of the disclosure, the ATE 150 includes a controller 170, and an interface 151. The interface 151 includes any suitable components, such as pin electronics, pin driver, pin sensor, parametric measurement unit (PMU), and the like, that can operate on the DUT 110 to perform test. In an example, a PMU is configured to apply voltage at a pin and measure current at the same pin. The controller 170 controls the interface 151 to operate on the DUT 110 according to the test flow 160, receives test results from the interface 151, and determines the quality of the DUT 110 based on the test results.

According to an embodiment of the disclosure, the test flow 160 includes a plurality of parametric tests 161 that are inserted at different positions in the sequence of the tests. According to an aspect of the disclosure, the DUT 110 consumes power during test, and may heat up itself, thus the temperature of the DUT 110 can be different at the different positions in the test, and in an embodiment the temperature of the DUT 110 is different than the temperature at which the limit value of the electric parameter is specified in a product datasheet specification. In an example, an I/O test consumes relatively low power, and the temperature of the DUT 110 during and immediately after I/O test is relatively low. The CPU test and the memory test consume relatively large power and the temperature of the DUT significantly increases during the CPU test and the memory test. The positions of the plurality of parametric tests 161 in the test flow 160 can be selected that temperatures of the DUT 110 at the plurality of parametric tests 161 have a relatively large variation. Although the temperatures at which the electrical parameter of the DUT 110 is actually tested deviate from the specified temperature, in an embodiment, a value of the electrical parameter for the DUT 110 at the specified temperature is derived based on actual measurements of the electrical parameter and a model characterizing performance of the DUT.

In an example, the test flow 160 is implemented in the form of a test software program. For example, each test is a module or a function in the test software program. The controller 170 is implemented as a processor executing software programs. The processor executes the test software program and controls the interface 151 to sequentially act on the DUT 110 to perform the sequence of tests. In response to a parametric test 161, the interface 151 acts on the DUT 110 to measure one or more electrical parameters and to measure a temperature of the DUT 110.

Further, the controller 170 receives measured values of the electrical parameter with corresponding temperatures. In an example, the controller 170 receives a first measured value of the electrical parameter and corresponding temperature (P1, T1) in response to a first parametric test 161, and receives a second measured value of the electrical parameter and corresponding temperature (P2, T2) in response to a second parametric test 161.

In addition, in an embodiment, the controller 170 employs a pre-constructed model characterizing the relationship of the electrical parameter and the temperature. The pre-constructed model may have one or more unknown coefficients. In an example, the coefficients are DUT dependent such that different DUTs may have different coefficients. Based on one or more measured value of the electrical parameter and the corresponding temperature of the DUT 110, the controller 170 determines the coefficients for the DUT 110.

Further, the controller 170 determines a value of the electrical parameter at the specified temperature ($T_{SPEC}$) according to the model, even though the electrical parameter was tested at temperatures other than the specified temperature. For example, the controller 170 uses the model with the solved coefficients to calculate the value of the electrical parameter at the specified temperature for the DUT 110. Then, the controller 170 determines the quality of the DUT 110 based on the determined value. In an example, the controller 170 sorts the DUT 110 into different bins, such as a high speed bin, a typical bin, a low speed bin, and the like, based on the determined value. In another example, the controller 170 determines pass or fail based on the determined value.

Figure 2:
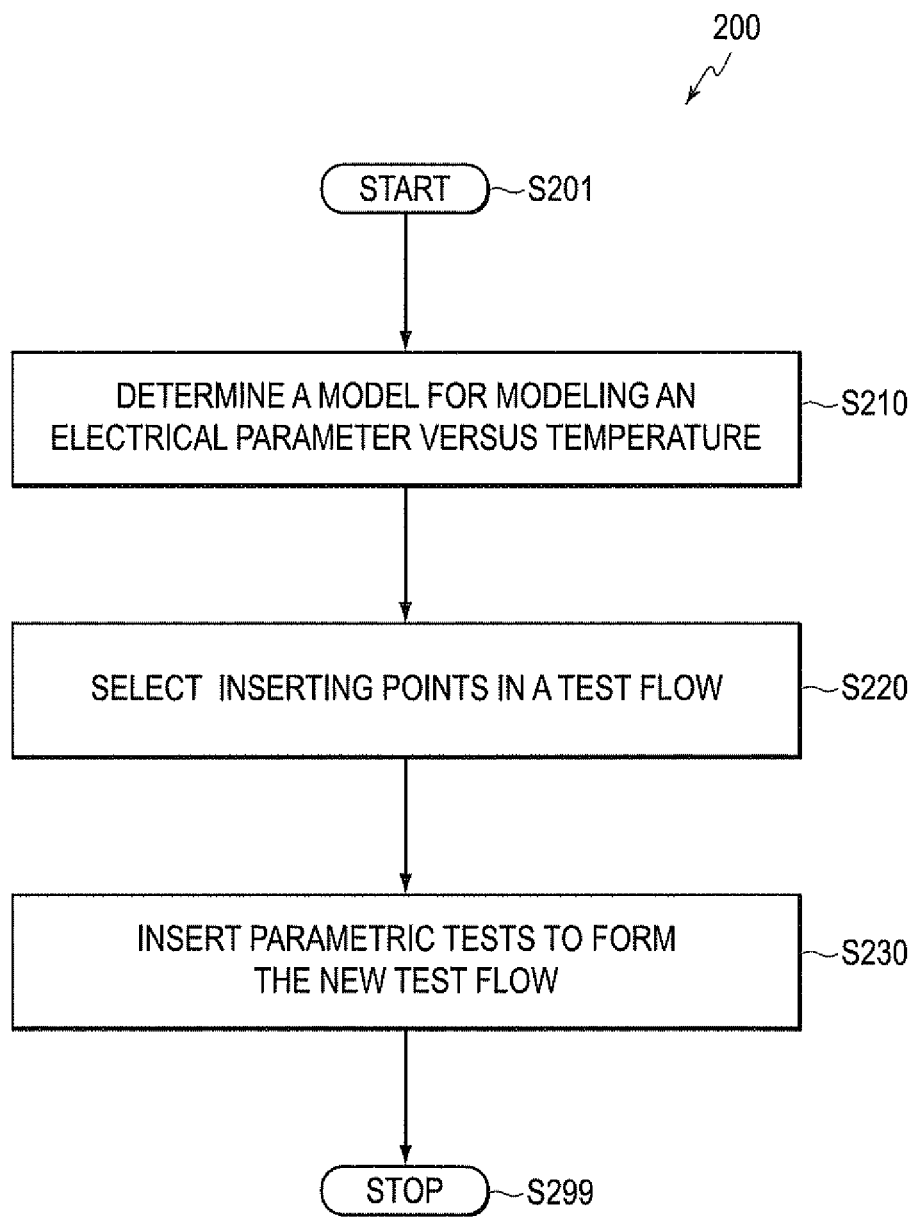
FIG. 2 shows a flow chart outlining a process example 200 for generating a test flow according to an embodiment of the disclosure.

FIG. 2 shows a flow chart outlining a process example 200 for generating a test flow, such as the test flow 160 according to an embodiment of the disclosure. The process starts at S201 and proceeds to S210.

At S210, a prototype model that models, or characterizes, an electrical parameter as a function of temperature is determined. In an example, a polynomial model, such as a linear model, a quadratic model, and the like, is determined to model an electrical parameter changing with temperature. In another example, a non-polynomial model is determined to model an electrical parameter changing with temperature. The model can include coefficients that are DUT dependent variables.

In an embodiment, multiple DUTs are selected to undergo a characterization process to characterize the electrical parameter changing with the temperature. During the characterization process, for each DUT, the electrical parameter is measured at various different temperatures. Based on the characterization, the prototype model is constructed.

At S220, a plurality of inserting points in a test flow is selected. In an example, for a linear model, at least two inserting points in a test flow are selected. For example, one of the two inserting points is immediately after an I/O test following which the DUT is expected to have a relatively low temperature, and another inserting point is after one or more high power consuming tests, such as after a memory test and/or CPU test that are expected to significantly raise the temperature of the DUT. Thus, the two inserting points have a relatively large temperature differential.

In another example, for a quadratic model, at least three inserting points in a test flow are selected. For example, a first of the three inserting points is immediately after an I/O test following which the DUT is expected to have a relatively low temperature, a second of the three inserting points is immediately after one of the high power consuming tests, following which the DUT is expected to have a relatively higher temperature than after the I/O test, and a third of the three inserting points is after completion of all of the high power consuming tests following which the DUT is expected to have an even higher temperature.

At S230, parametric tests are inserted in the test flow at the selected inserting points to form a new test flow. Then, the new test flow is used to test DUTs. The process then proceeds to S299 and terminates.

According to an embodiment of the disclosure, the process 200 is performed by a processor to automatically generate the new test flow.

Figure 3:
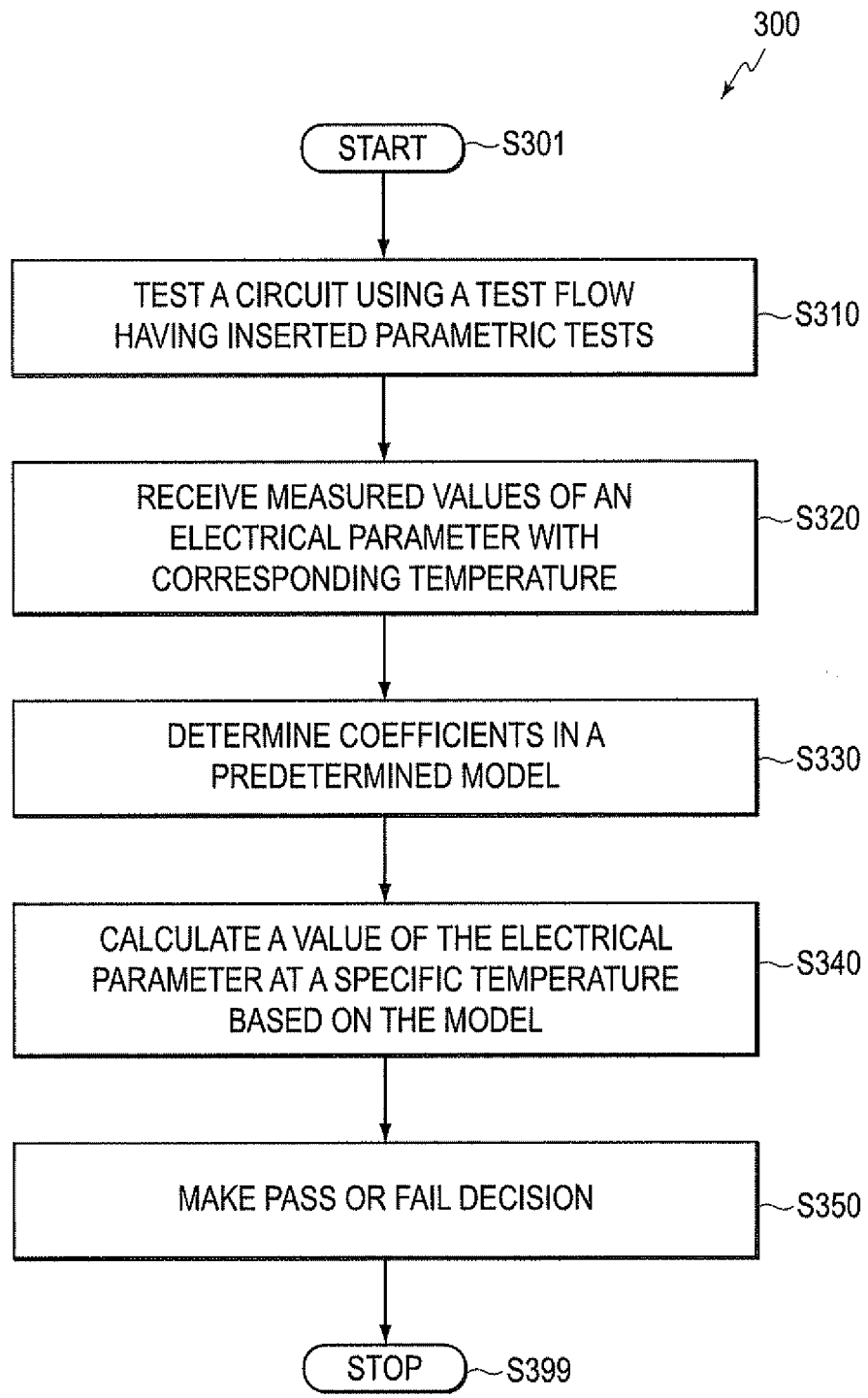
FIG. 3 shows a flow chart outlining a process example 300 for testing a circuit according to an embodiment of the disclosure.

FIG. 3 shows a flow chart outlining a process example 300 for test equipment, such as ATE 150, to test a circuit according to an embodiment of the disclosure. The process starts at S301 and proceeds to S310.

At S310, the ATE 150 tests the DUT 110 according to the test flow 160. In an embodiment, the test flow 160 includes a sequence of tests, and the sequence of tests includes a one or more parametric tests 161. According to an embodiment of the disclosure, the positions to insert the one or more parametric tests 161 can be selected such that temperatures of the DUT under the plurality parametric tests 161 have a relatively large variation. In an example, in response to a parametric test 161, the interface 151 acts on the DUT 110 to measure one or more electrical parameters and to measure a temperature of the DUT 110 when the electrical parameters are measured.

At S320, the ATE 150 receives measured values of the electrical parameter with corresponding temperature. In an example, the ATE 150 receives a first measured value of the electrical parameter and corresponding temperature (P1, T1) in response to a first parametric test 161, and receives a second measured value of the electrical parameter and corresponding temperature (P2, T2) in response to a second parametric test 161.

At S330, the ATE 150 determines coefficients in a pre-constructed model for a circuit type to which the DUT corresponds. According to an embodiment of the disclosure, the pre-constructed model characterizes a relationship of the electrical parameter to temperature. The pre-constructed model includes unknown coefficients. In an example, the coefficients are DUT dependent.

In an embodiment, the polynomial model is pre-constructed to model behavior of the electrical parameter changing as a function of temperature within a temperature range. The polynomial model includes unknown coefficients. Based on the received values of the electrical parameter with the corresponding temperatures, the unknown coefficients are solved.

In an example, when the polynomial model is a linear model, the linear model has two unknown coefficients. In an example, the two coefficients can be solved based on measurements of two parametric tests, using any suitable technique, such as an algebraic technique, matrix calculation, and the like. In another example, the two coefficients can be solved based on measurements of more than two parametric tests, using curve fitting, for example.

At S340, the ATE 150 determines a value of the electrical parameter at a specified temperature according to the model. In an example, the quality of the DUT 110 is determined using a limit value of the electrical parameter at the specified temperature. In an example, a product datasheet specification specifies a lower limit value of the electrical parameter at the specified temperature. Then, when the electrical parameter of a DUT at the specified temperature is higher than the lower limit value, the DUT satisfies the product datasheet specification; and when the electrical parameter of the DUT at the specified temperature is lower than the lower limit value, the DUT fails the product datasheet specification. The ATE 150 uses the model to derive the value of the electrical parameter at the specified temperature for the DUT 110. Thus, while the parametric tests 161 are not performed at the specified temperature, the measured values for the electrical parameters with corresponding temperatures can be used to predict the value of the electrical parameter of the DUT 110 at the specified temperature.

At S350, the ATE 150 determines the quality of the DUT 110 based on the derived value. In an embodiment, the ATE 150 makes pass or fail decision of the DUT 110 based on the derived value. In an example, the ATE 150 compares the derived value with the limit value to make the decision. In another embodiment, the ATE 150 sorts the DUT 110 into different bins, such as a high speed or fast bin, a regular speed or typical bin, a low speed or slow bin, and the like, based on the derived value. Then the process proceeds to S399 and terminates.

Figure 4A:
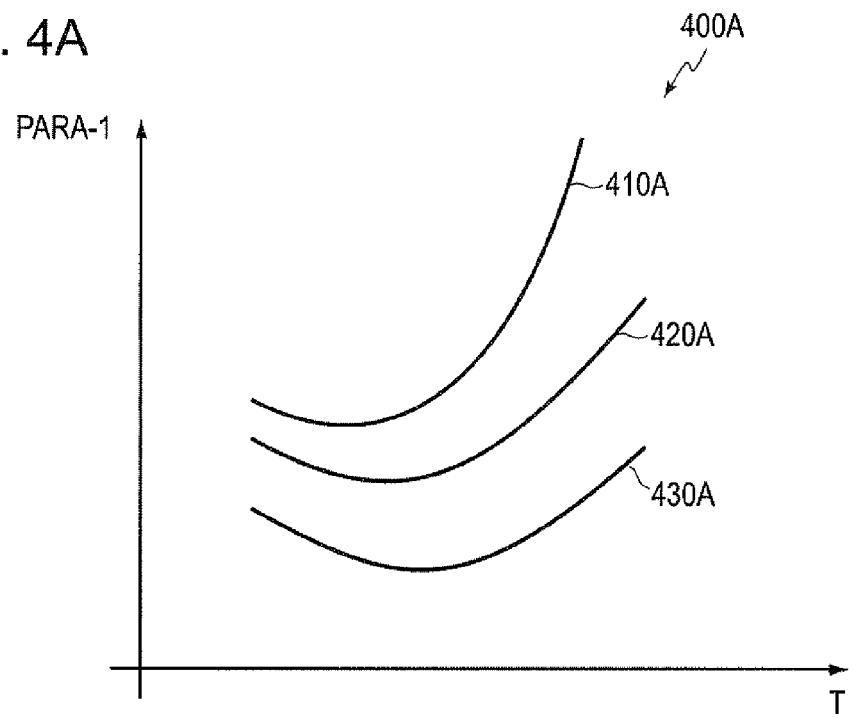
FIGS. 4A and 4B show plots of parameters vs. temperature according to an embodiment of the disclosure.

FIG. 4A shows a plot 400A of an electrical parameter (PARA-1) characterization according to an embodiment of the disclosure. In FIG. 4A, the X-axis indicates temperature, and the Y-axis indicates a measured value of the electrical parameter (PARA-1). The plot 400A includes a first curve 410A, a second curve 420A and a third curve 430A. In an example, the first curve 410A corresponds to measurements on a first device in a characterization process, the second curve 420A corresponds to measurements on a second device in the characterization process, and the third curve 430A corresponds to measurements on a third device in the characterization process.

During the characterization process, in an embodiment, a plurality of devices, such as the first, second and third devices, are selected and characterized to determine a suitable model to model PARA-1 changing with temperature. In an example, the first, second and third devices correspond to fast, regular and slow devices. Then, a thermal source, such as a heat source, a heat sink, and the like is controlled to change the temperature on the devices. Further, PARA-1 of the device and corresponding temperature of the device are measured at various temperatures, such as temperatures in a range. Based on the measurements, the curves 410A-430A can be plotted, and a model can be constructed. In the FIG. 4A example, a quadratic model can be selected to model PARA-1 changing with temperature in the temperature range, such as the quadratic model in Eq. 1.

$$\text{PARA-1} = \alpha_0 + \alpha_1 \times T + \alpha_2 \times T^2 \qquad \text{Eq. 1}$$

In an example, the quadratic model includes three variable coefficients, such as $\alpha_0$, $\alpha_1$, and $\alpha_2$ in Eq. 1, that are device dependent.

Figure 4B:
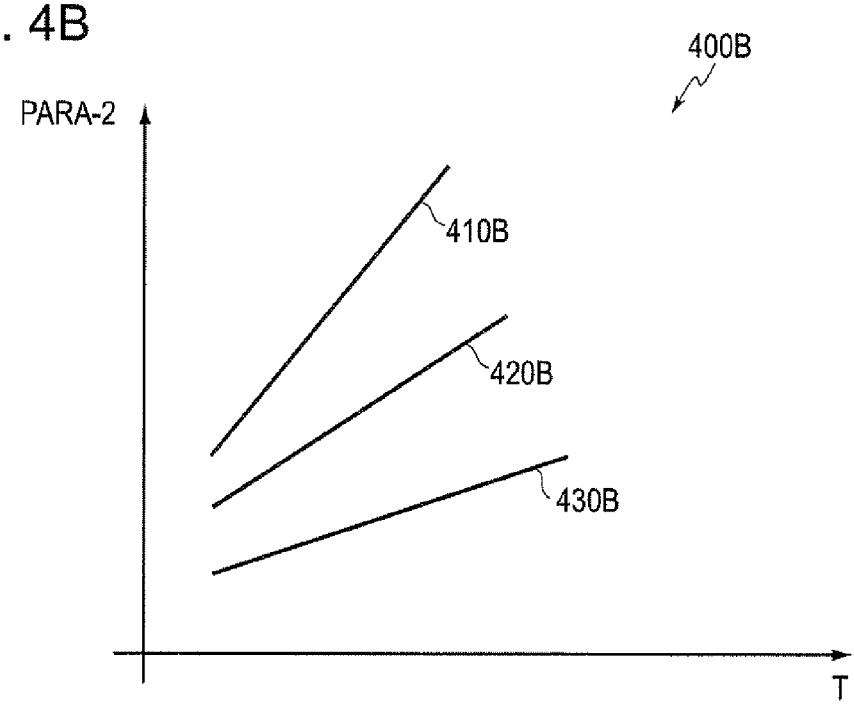

FIG. 4B shows a plot 400B of an electrical parameter (PARA-2) characterization according to an embodiment of the disclosure. The X-axis is temperature, and the Y-axis is measured value of the electrical parameter (PARA-2). The plot 400B includes a first curve 410B, a second curve 420B and a third curve 430B. In the FIG. 4B example, a linear model can be selected to model PARA-2 changing with temperature in the temperature range, such as the liner model in Eq. 2.

$$\text{PARA-2} = b_0 + b_1 \times T \qquad \text{Eq. 2}$$

In an example, the linear model includes two variable coefficients, such as $b_0$ and $b_1$ in Eq. 2, that are device dependent.

Figure 5A:
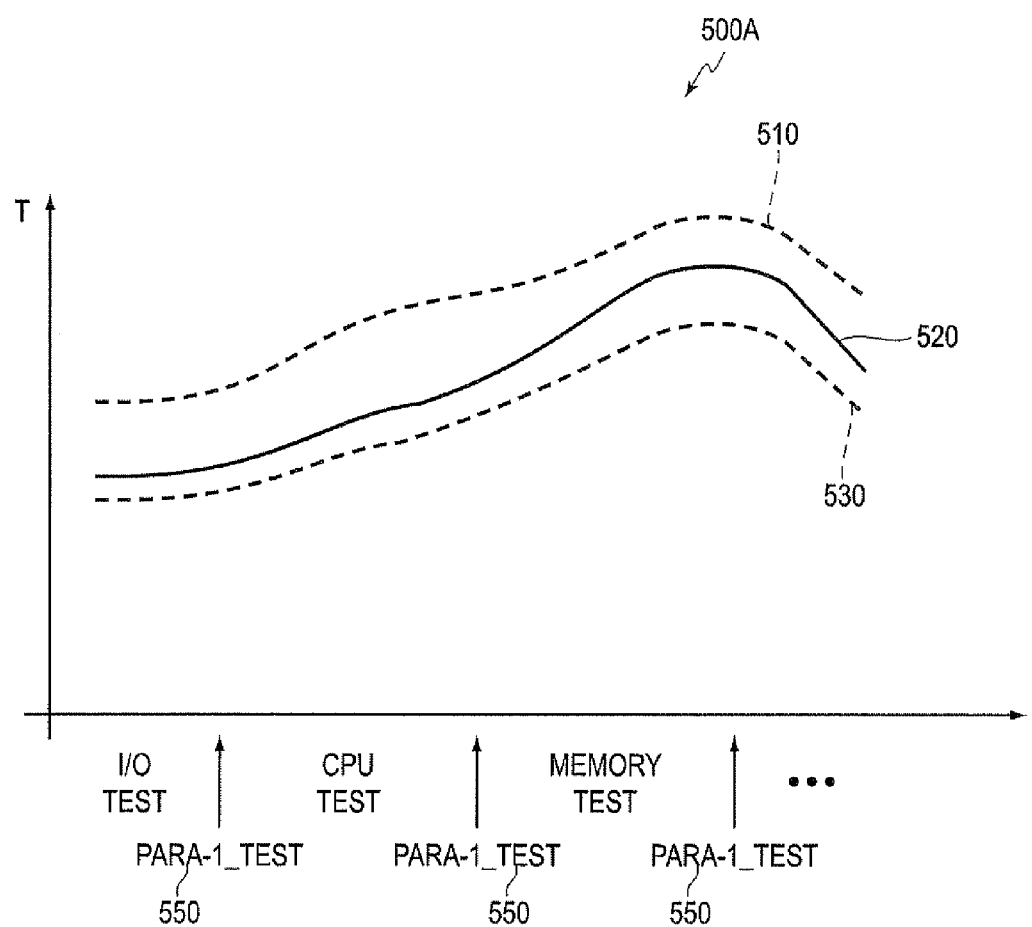
FIGS. 5A and 5B show plots of temperature variation during a test flow according to an embodiment of the disclosure.

FIG. 5A shows a plot 500A of temperature variation during a test flow according to an embodiment of the disclosure. The test flow includes a sequence of various tests. In the FIG. 5A example, the test flow starts with I/O test. The I/O test is followed by CPU test and memory test.

According to an embodiment of the disclosure, during test, a DUT consumes power, and portion of the power is converted to heat and heats up the DUT. In an example, I/O test consumes relatively low power, and the temperature increase of the DUT during I/O test is relatively low. The CPU test and the memory test consume relatively large power and the temperature of the DUT significantly increases during the CPU test and the memory test.

According to an embodiment of the disclosure, a DUT is tested according to the test flow, and the temperature of the DUT is monitored during the test. In the FIG. 5A example, a curve 520 shows a temperature profile for the DUT during the test.

Further, according to an embodiment of the disclosure, the temperature profile can be different due to, for example, handler to handler differences, handler setup, device order, start up temperature, and the like. In an embodiment, a plurality of DUTs is tested according to the test flow, and the temperature of the plurality of DUTs is monitored during the test. In an example, the plurality of DUTs can be selected from dies on different locations of a wafer, dies from different wafers, and dies from different lots. Further, the plurality of DUTs can be tested using different test equipment.

In the FIG. 5A example, the temperature of the plurality of DUTs changes between an upper curve 510 and a lower curve 530.

In an embodiment, according to the temperature profile, a plurality of inserting points in the test flow can be selected to insert parametric tests. For example, to solve three coefficients in the quadratic model that models PARA-1 in FIG. 4A, three inserting points are selected to insert parametric tests (PARA-1_TEST) 550. Each parametric test 550 measures PARA-1 of a DUT and a corresponding temperature of the DUT at the time of the parametric test 550. In an embodiment, one or more of a frequency parameter and current consumption parameter of a DUT is measured at each of the parametric test 550, for example.

It is noted that more than three inserting points can be selected to insert parametric tests in the test flow. However, parametric tests also consume test time, and a large number of parametric tests can also increase test cost and thus increase chip or device cost.

Figure 5B:
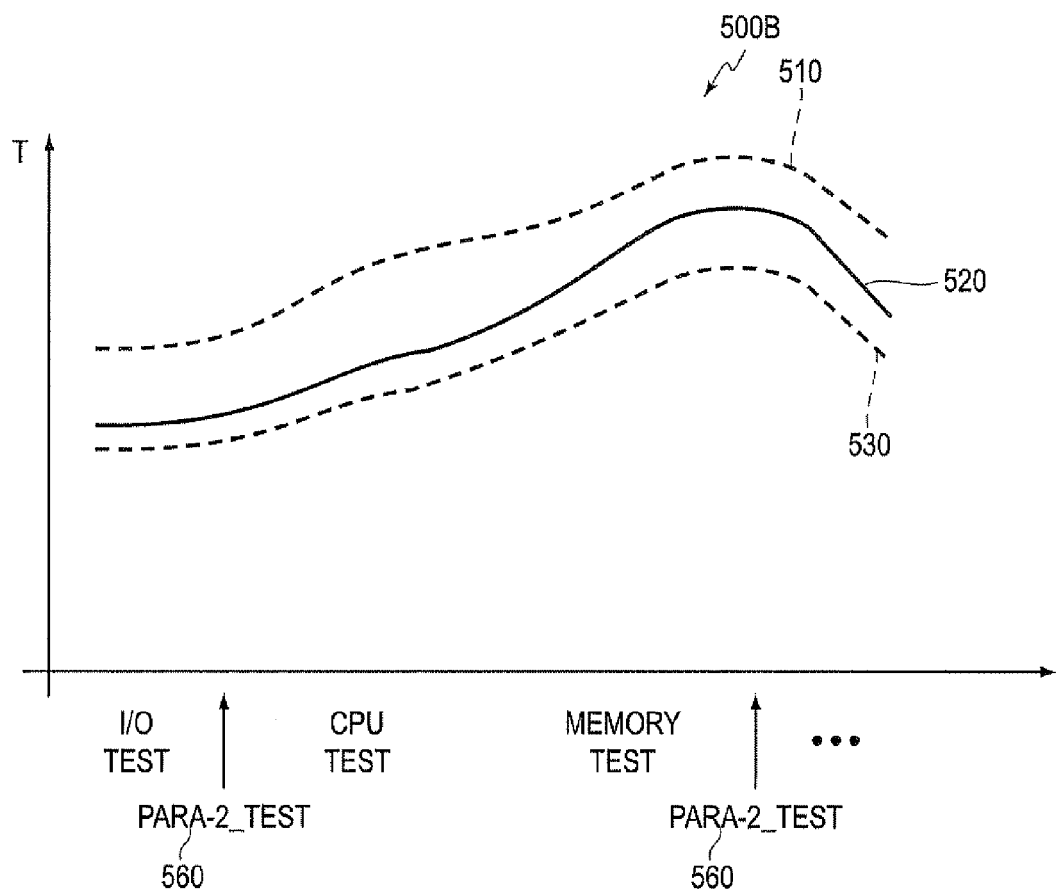

FIG. 5B is similar to FIG. 5A. To solve the two coefficients of the linear model that models PARA-2 in FIG. 4B, two inserting points are selected to insert parametric tests (PARA-2_TEST) 560. Each parametric test 560 measures PARA-2 of a DUT and a corresponding temperature of the DUT at the time of the parametric test 560. In an embodiment, one or more of a frequency parameter and current consumption parameter of a DUT is measured at each of the parametric test 560, for example It is noted that more than two inserting points can be selected to insert parametric tests in the test flow. However, parametric tests also consume test time, and a large number of parametric tests can also increase test cost and thus increase chip or device cost.

According to an embodiment of the disclosure, a reduced number of parametric tests are inserted in a test flow to reduce test cost. In an embodiment, a model that models maximum working frequency at the specified temperature is determined. In an embodiment, a single measurement of a parameter, such as maximum working frequency for example, is made at any suitable temperature. The single measured parameter is applied to a model characterizing the DUT to predict the parameter at a specified temperature that is different from the temperature at which the parameter is measured.

Thus, in such embodiment a single frequency test is needed and can be inserted at any suitable location in a test flow. Because only one frequency test is needed and the frequency test can be performed at any suitable temperature, test time and test cost is reduced.

Figure 6B:
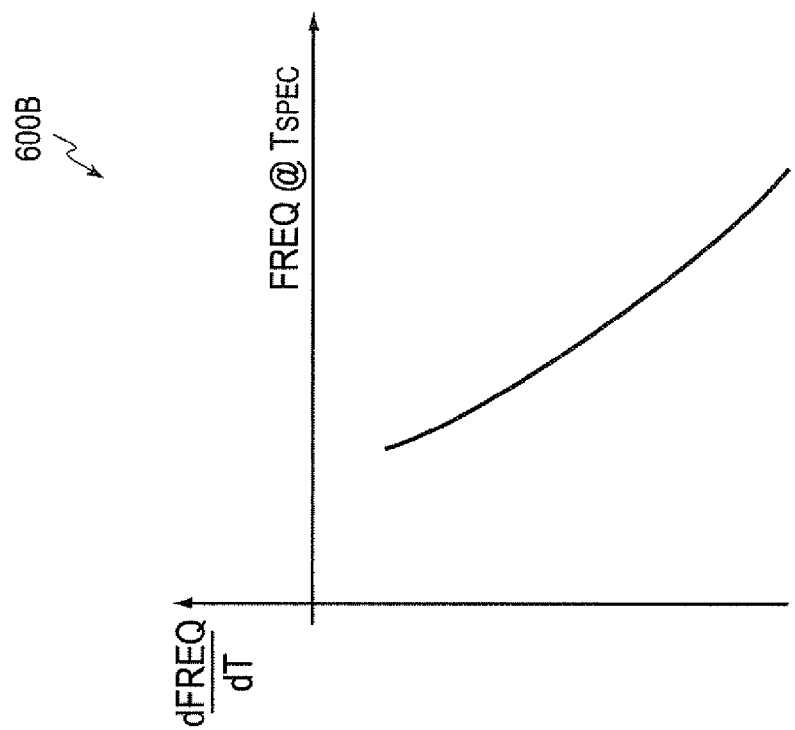
FIGS. 6A and 6B show plots for a frequency to temperature model according to an embodiment of the disclosure.
Figure 6A:
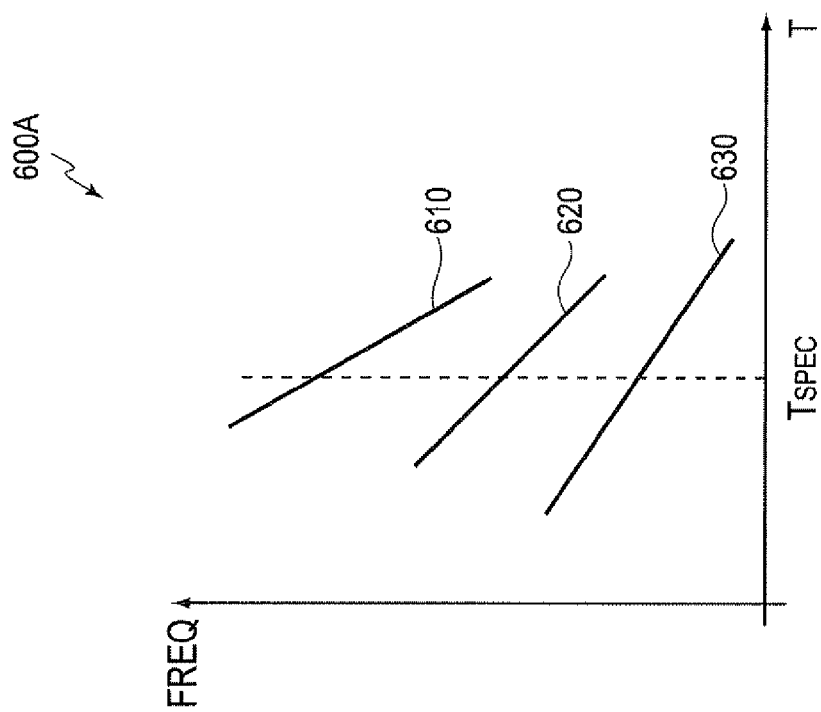

FIG. 6A shows a plot 600A of a maximum frequency (FREQ) characterization according to an embodiment of the disclosure. The X-axis is temperature (T), and the Y-axis is measured value of a parameter, which in the example is the maximum operating frequency (FREQ) at which the IC is functional. The plot 600A includes a first curve 610, a second curve 620, and a third curve 630. In an example, the first curve 610 corresponds to maximum frequency measurements on a first device in a characterization process, the second curve 620 corresponds to maximum frequency measurements on a second device in the characterization process, and the third curve 630 corresponds to maximum frequency measurements on a third device in the characterization process.

During the characterization process, in an embodiment, a plurality of devices, such as the first, second and third devices, are selected and characterized to determine a suitable model to characterize maximum frequency changing with temperature. In an example, the first, second and third devices correspond to fast, typical and slow devices. Then, a thermal source, such as a heat source, a heat sink, and the like is controlled to change the temperature on the devices. In another example, the first, second and third devices are randomly selected from different wafers, different lots, and the like or are collected in a database over time from testing numerous DUTs that include all process plurality. Further, measurements of the maximum frequency and corresponding temperature is conducted at various temperatures, such as temperatures in a range. Based on the measurements, the curves 610-630 can be plotted, and a model can be determined. In the FIG. 6A example, a linear model, such as Eq. 3 can be used to model the maximum frequency changing with temperature.

$$FREQ(T) = Slope \times T + B \qquad \text{Eq. 3}$$

where Slope and B are coefficients. Slope is the slope of the linear model and B is the intercept of the linear model.

Further, according to an embodiment of the disclosure, the maximum frequency at the specified temperature ($T_{SPEC}$) is a function of the slope of the linear model. FIG. 6B shows a plot 600B for characterizing the slope $$\left(\left(\frac{dFREQ}{dT}\right)\right)$$

and the maximum frequency at the specified temperature (FREQ@ $T_{SPEC}$). In an embodiment, the slope is a function of the maximum frequency at the specified temperature, as shown by Eq. 4:

$$Slope = Func(FREQ(T_{SPEC})) \qquad \text{Eq. 4}$$

In an example, a linear model is used to model the slope and the maximum frequency at the specified temperature, as shown by Eq. 5

$$Slope = \alpha \times FREQ(T_{SPEC}) + \beta \qquad \text{Eq. 5}$$

where α and β are coefficients that can be determined based on the characterization in FIG. 6B.

Further, in an embodiment, when a maximum frequency (FREQ($T_{TEST}$)) of a DUT is measured at a temperature ($T_{TEST}$), the relationship of the measured frequency to the maximum working frequency at the specified temperature ($T_{SPEC}$) can be expressed by Eq. 6 according to the linear model in Eq. 3:

$$FREQ(T_{SPEC}) - FREQ(T_{TEST}) = Slope \times (T_{SPEC} - T_{TEST}) \qquad \text{Eq. 6}$$

Further, by replacing the Slope in Eq. 6 with the Eq. 5, the maximum working frequency at the specified temperature can be calculated by Eq. 7

$$FREQ(T_{SPEC}) = \frac{FREQ(T_{TEST}) + \beta \times (T_{SPEC} - T_{TEST})}{1 - \alpha \times (T_{SPEC} - T_{TEST})} \qquad \text{Eq. 7}$$

Thus, in accordance with an embodiment, only a single frequency measurement at a suitable temperature, which can be different from the specified temperature, is needed to determine the maximum working frequency at the specified temperature.

FIG. 7 shows a flow chart outlining a process example 700 for test equipment, such as the ATE 150 to test a circuit, such as the DUT 110, according to an embodiment of the disclosure. In this embodiment, the test flow 160 includes a single parametric test 161, such as the one after the memory test, for testing a maximum working frequency. The process starts at S701, and proceeds to S710.

At S710, in response to the single parametric test 161, the ATE 150 measures a maximum frequency of the DUT 110.

At S720, in response to the single parametric test 161, the ATE 150 also measures a temperature of the DUT 110 at the time of the parametric test.

At S730, the ATE 150 determines whether the measured temperature is larger than the specified temperature for the DUT, and whether the measured maximum working frequency is larger than the limit frequency. When both conditions are satisfied, the process proceeds to S770; otherwise, the process proceeds to S740.

At S740, the ATE 150 derives a predicted maximum working frequency at the specified temperature, for example, according to Eq. 7.

At S750, the ATE 150 determines whether the predicted maximum working frequency at the specified temperature is larger than the limit frequency. When the predicted maximum working frequency is larger than the limit frequency, the process proceeds to S770; otherwise, the process proceeds to S760.

At S760, the ATE 150 determines that the DUT fails the maximum frequency test. The process proceeds to S799 and terminates.

At S770, the ATE 150 determines that the DUT passes the maximum frequency test. The process proceeds to S799 and terminates.

It is noted that the process 700 can be suitably modified. In an example, at S760, the ATE 150 further determines whether the DUT satisfies another limit, such as a slower limit, for the maximum frequency test, and bins the DUT as a slow device when the DUT satisfies the slower limit.

According to an embodiment of the disclosure, the DUT 110 includes an on-chip ring oscillator, the frequency of the ring oscillator is indicative of the maximum working frequency of the DUT 110. In the maximum frequency test, the ATE 150 measures the frequency of the ring oscillator.

According to another embodiment of the disclosure, the ATE 150 provides a clock signal to the DUT 110. During the maximum frequency test, the ATE 150 steps up the frequency of the clock signal. At each step, the ATE 150 performs function tests on the DUT 110 to determine whether the DUT 110 operates correctly. When the DUT 110 passes the functional tests, the clock signal steps up; otherwise, the maximum frequency is determined to be the last clock frequency under which the DUT 110 passes functional testing.

While aspects of the present disclosure have been described in conjunction with the specific embodiments thereof that are proposed as examples, alternatives, modifications, and variations to the examples may be made.

Accordingly, embodiments as set forth herein are intended to be illustrative and not limiting. There are changes that may be made without departing from the scope of the claims set forth below.

What is claimed is:

1. A method, comprising:
   measuring an electrical parameter of a device under test (DUT) and measuring, using a temperature sensor, a corresponding temperature of the DUT one or more times;
   determining coefficients, in a pre-constructed model based on a plurality of measured values of the electrical parameter and corresponding measured temperatures, to characterize a relationship of the electrical parameter of the DUT to the temperature of the DUT, wherein
      the pre-constructed model characterizes a relationship of the electrical parameter to the temperature of a circuit type corresponding to the DUT, and
      the coefficients are DUT-dependent variables of the DUT; and
   determining a fitness of the DUT to meet a specified performance requirement based on the pre-constructed model and a limit value of the electrical parameter at a specified temperature.

2. The method of claim 1, wherein determining the fitness of the DUT to meet the specified performance requirement based on the pre-constructed model and the limit value of the electrical parameter at the specified temperature further comprises:
   determining a value for the electrical parameter at the specified temperature according to the pre-constructed model; and
   comparing the determined value to the limit value to determine the quality of the DUT.

3. The method of claim 1, wherein determining the fitness of the DUT to meet the specified performance requirement based on the pre-constructed model and the limit value of the electrical parameter at the specified temperature further comprises:
   determining a temperature value at which the DUT has the limit value of the electrical parameter according to the pre-constructed model; and
   comparing the determined temperature value to the specified temperature to determine the quality of the DUT.

4. The method of claim 1, wherein measuring the electrical parameter of the DUT and the corresponding temperature of the DUT for the one or more times further comprises:
   testing the DUT according to a test flow that includes a plurality of parametric tests inserted in a sequence of other tests; and
   measuring the electrical parameter of the DUT and the corresponding temperature in response to each of the parametric tests.

5. The method of claim 1, wherein determining the coefficients in the pre-constructed model based on the plurality of measured values of the electrical parameter and corresponding temperatures further comprises:
   determining the coefficients in a pre-constructed polynomial model based on the measured values of the electrical parameter and corresponding temperatures.

6. The method of claim 1, wherein measuring the electrical parameter of the DUT and the corresponding temperature of the DUT one or more times further comprises:
   measuring the electrical parameter of the DUT and a corresponding junction temperature of the DUT.

7. The method of claim 1, wherein measuring the electrical parameter of the DUT and the corresponding temperature of the DUT one or more times further comprises:
   measuring at least one of an operating frequency, a current consumption and an oscillator frequency and the corresponding temperature of the DUT.

8. The method of claim 1, wherein measuring the electrical parameter of the DUT and the corresponding temperature of the DUT one or more times further comprises:
   measuring an operating frequency of the DUT and the corresponding temperature of the DUT for a single time.

9. The method of claim 8, further comprising:
   determining the coefficients in the pre-constructed model based on the single measured value of the operating frequency and the corresponding single measured temperature.

10. An integrated circuit (IC) chip that is tested according to a method, the method comprising:
    measuring an electrical parameter of a device under test (DUT) and measuring, using a temperature sensor, a corresponding temperature of the DUT one or more times;
    determining coefficients, in a pre-constructed model based on a plurality of measured values of the electrical parameter and corresponding measured temperatures, to characterize a relationship of the electrical parameter of the DUT to the temperature of the DUT, wherein
       the pre-constructed model characterizes a relationship of the electrical parameter to the temperature of a circuit type corresponding to the DUT, and
       the coefficients are DUT-dependent variables of the DUT; and
    determining a fitness of the DUT to meet a specified performance requirement based on the pre-constructed model and a limit value of the electrical parameter at a specified temperature.

11. A test system, comprising:
    an interface configured to measure an electrical parameter of a device under test (DUT) and measure, using a temperature sensor, a corresponding temperature of the DUT; and
    a controller configured to
       control the interface to measure the electrical parameter of the DUT and measure the corresponding temperature of the DUT one or more times,
       determine coefficients, in a pre-constructed model based on the measured values of the electrical parameter and the corresponding measured temperatures, to characterize a relationship of the electrical parameter of the DUT to the temperature of the DUT, and
       determine a fitness of the DUT to meet a specified performance requirement based on the pre-constructed model and a limit value of the electrical parameter at a specified temperature, wherein
       the pre-constructed model characterizes a relationship of the electric parameter to the temperature of a circuit type corresponding to the DUT, and
       the coefficients are DUT-dependent variables of the DUT.

12. The test system of claim 11, wherein the controller is configured to determine a value of the electrical parameter at the specified temperature according to the pre-constructed model, and compare the value to the limit value to determine the fitness of the DUT.

13. The test system of claim 11, wherein the controller is configured to determine a temperature at which the DUT has the limit value of the electrical parameter according to the pre-constructed model, and compare the temperature to the specified temperature to determine the fitness of the DUT.

14. The test system of claim 11, wherein the controller is configured to control the interface according to a test flow that includes a plurality of parametric tests inserted in a sequence of other tests, and the interface is configured to measure the electrical parameter of the DUT and the corresponding temperature in response to each of the parametric tests.

15. The test system of claim 11, wherein the controller is configured to determine the coefficients in a pre-constructed polynomial model based on the measured values of the electrical parameter and corresponding temperatures.

16. The test system of claim 11, wherein the interface is configured to receive from a temperature sensor in the DUT a sensed junction temperature.

17. The test system of claim 11, wherein the interface is configured to measure at least one of an operating frequency, a current consumption and an oscillator frequency.

18. The test system of claim 11, wherein the interface is configured to measure an operating frequency of the DUT and the corresponding temperature for a single time and determine the coefficients in the pre-constructed model based on the measured value of the electrical parameter and the corresponding measured temperature.

19. The test system of claim 11 configured to test a DUT that is defined by an integrated circuit device.

20. A method, comprising:
constructing a model for modeling an electrical parameter of a device changing with a temperature, wherein the model includes a plurality of coefficients that are device-under-test (DUT) dependent variables;
determining an integer number of measurements of the electrical parameter and the corresponding temperature for which the integer number of the measurements of the electrical parameter and the corresponding temperature provides a suitable indication of the device meeting the electrical parameter, at a specified temperature that is not measured, using the model;
performing, for at least the integer number of times on a DUT of a circuit type corresponding to the device, a parametric test measuring the electrical parameter and measuring, using a temperature sensor, the corresponding temperature; and
ascertaining a fitness of the DUT to meet a specified performance requirement at a non-measured temperature based on the model and the parametric test.

* * * * *